(12) United States Patent
Lee

(10) Patent No.: US 7,230,875 B2
(45) Date of Patent: Jun. 12, 2007

(54) DELAY LOCKED LOOP FOR USE IN SYNCHRONOUS DYNAMIC RANDOM ACCESS MEMORY

(75) Inventor: Seong Hoon Lee, Ichon-Shi (KR)

(73) Assignee: Hynix Semiconductor, Inc., Ichon-shi (KR)

(*) Notice: Subject to any disclaimer, the term of this patent is extended or adjusted under 35 U.S.C. 154(b) by 1383 days.

(21) Appl. No.: 09/970,388

(22) Filed: Oct. 2, 2001

(65) Prior Publication Data

US 2003/0210602 A1 Nov. 13, 2003

Related U.S. Application Data

(63) Continuation of application No. 09/703,405, filed on Oct. 31, 2000, now Pat. No. 6,333,896.

(30) Foreign Application Priority Data

Nov. 1, 1999 (KR) ............................... 1999-47924

(51) Int. Cl.
*G11C 8/00* (2006.01)
*G11C 7/00* (2006.01)
(52) U.S. Cl. ................. 365/233; 365/189.07; 365/194; 327/158; 327/159
(58) Field of Classification Search ................ 365/233, 365/189.07, 194; 327/158, 159, 161
See application file for complete search history.

(56) References Cited

U.S. PATENT DOCUMENTS 5,109,394 A * 4/1992 Hjerpe et al. ............... 375/373
5,463,337 A * 10/1995 Leonowich .................. 327/158
5,926,047 A * 7/1999 Harrison ...................... 327/159

OTHER PUBLICATIONS

WP 24.5 *A250Mb/s/pin 1Gb Double Data Rate SDRAM with a Bi-Directional Delay and an Inter-Bank Shared Redundancy Scheme*, 1999 IEEE International Solid-State Circuits Conference.
WP 24.2 *A2.5V333Mb/s/pin 1Gb Double Sata Rate SDRAM*, 1999 IEEE International Solid-State Circuits Conference.

* cited by examiner

*Primary Examiner*—Son Dinh
(74) *Attorney, Agent, or Firm*—Townsend and Townsend and Crew LLP

(57) ABSTRACT

A delay locked loop (DLL) for compensating for a skew in a synchronous dynamic random access memory includes: a delay model means for delaying an external clock signal by the skew to generate a delayed clock signal; a control unit, in response to the external clock signal and the delayed clock signal, for generating control signals, wherein the control signal includes a control clock signal, a delayed control signal, a replication signal and a replication enable signal; a first voltage controlled oscillator, in response to the control clock signal and the delayed control signal, for generating a measurement oscillating signal; a second voltage controlled oscillator, in response to the replication signal and the replication enable signal, for generating a replication oscillating signal; a first unit, in response to the measurement oscillating signal and the replication oscillating signal, for generating a DLL clock signal; and a second unit for comparing a phase difference between the DLL clock signal and the external clock signal to generate a voltage control signal, wherein time periods of the measurement oscillating signal and the replication oscillating signal are changed by the voltage control signal.

32 Claims, 6 Drawing Sheets

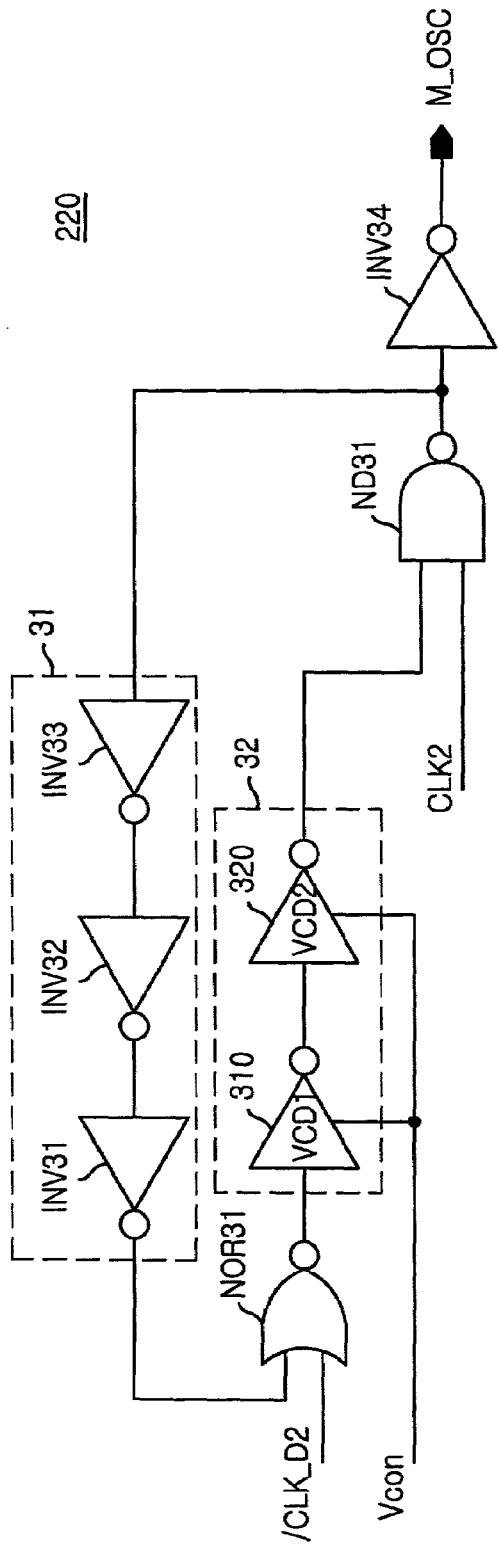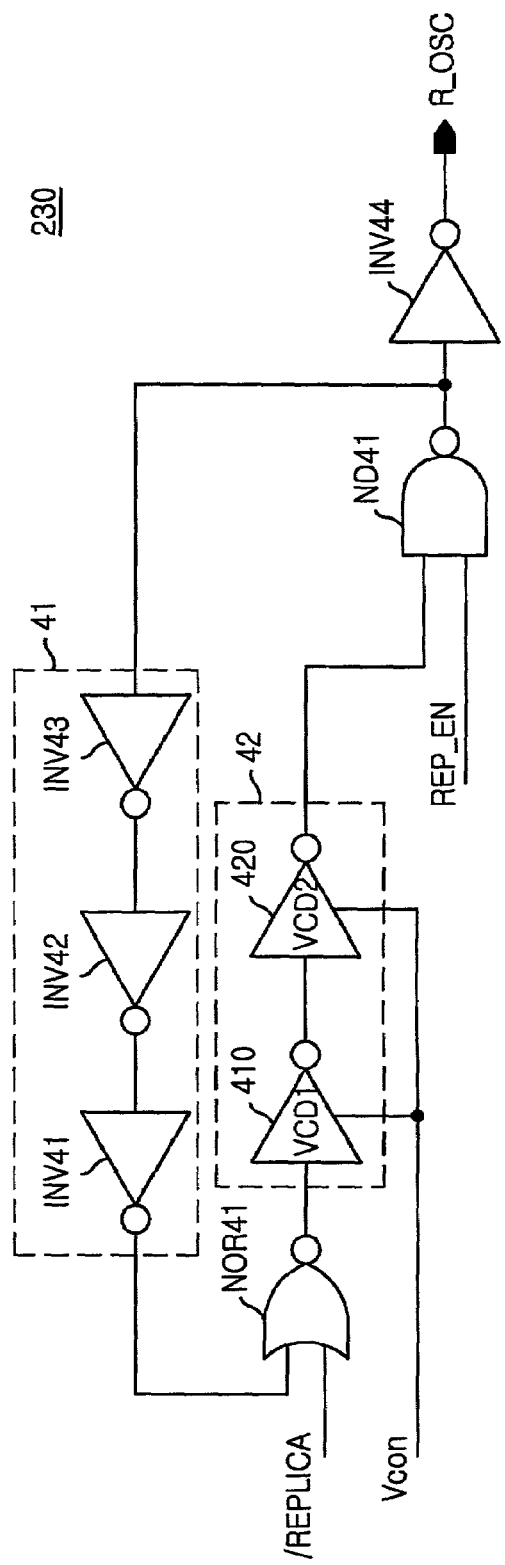

DELAY LOCKED LOOP FOR USE IN SYNCHRONOUS DYNAMIC RANDOM ACCESS MEMORY

BACKGROUND OF THE INVENTION

1. Field of the Invention

The present invention relates to a semiconductor integrated circuit; and, more particularly, to a delay locked loop for use in synchronous dynamic random access memory, which is capable of obtaining a fast locking time and a reduced jitter.

2. Description of the Prior Art

For achieving a high speed operation in a semiconductor memory device, a synchronous dynamic access memory (SDRAM) has been developed. The SDRAM operates in synchronization with an external clock signal. The SDRAM includes a single data rate (SDR) SDRAM, a double data rate (DDR) SDRAM, and the like.

Generally, when data are outputted in synchronization with the external clock signal, a skew between the external clock, signal and the output data is occurred. In the SDRAM, a delay locked loop (DLL) can be used to compensate for the skew between an external clock signal and an output data, or an external clock signal and an internal clock signal.

A digital DLL is implemented with a plurality of unit delay elements that are coupled in series. For increasing a resolution, a unit delay time should be minimized. As the unit delay time becomes smaller, however, more unit delay elements are needed. Consequently, power consumption as well as a chip size is increased much more.

SUMMARY OF THE INVENTION

It is, therefore, an object of the present invention to provide a delay locked loop which is capable of obtaining a fast locking time and a reduced jitter by combining a digital locking operation with an analog locking operation.

In accordance with an aspect of the present invention, there is provided a delay locked loop (DLL) for compensating for a skew in a synchronous dynamic random access memory, comprising: a delay model means for delaying an external clock signal by the skew to generate a delayed clock signal; a control means, in response to the external clock signal and the delayed clock signal, for generating control signals, wherein the control signal includes a control clock signal, a delayed control signal, a replication signal and a replication enable signal; a first voltage controlled oscillation means, in response to the control clock signal and the delayed control signal, for generating a measurement oscillating signal; a second voltage controlled oscillation means, in response to the replication signal and the replication enable signal, for generating a replication oscillating signal; a first means, in response to the measurement oscillating signal and the replication oscillating signal, for generating a DLL clock signal and a second means for comparing a phase difference between the DLL clock signal and the external clock signal to generate a voltage control signal, wherein time periods of the measurement oscillating signal and the replication oscillating signal are changed by the voltage control signal.

BRIEF DESCRIPTION OF THE DRAWINGS

Other objects and aspects of the invention will become apparent from the following description of the embodiments with reference to the accompanying drawings, in which:

FIG. 3 is a circuit diagram illustrating a VCO shown in FIG. 2,

FIG. 4 is a circuit diagram illustrating a mirror VCO shown in FIG. 2;

DETAILED DESCRIPTION OF THE PREFERRED EMBODIMENTS

Figure 1:
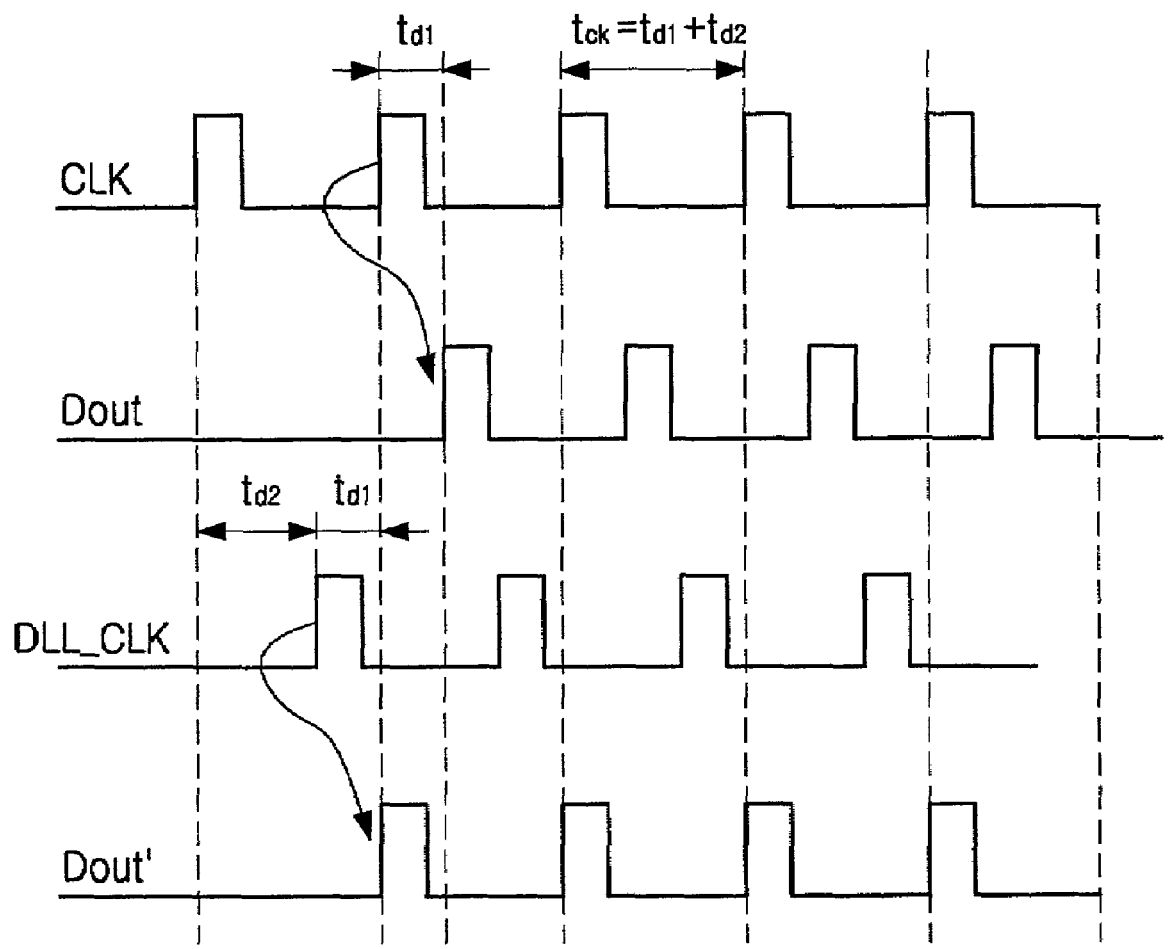
FIG. 1 is a timing chart for explaining a principle of a DLL.

FIG. 1 is a timing chart for explaining a principle of a DLL. Here, $t_{ck}$ denotes a time period of an external clock signal CLK.

As shown, when data is outputted in synchronization with the external clock signal CLK, a skew $t_{d1}$ between the external clock signal CLK and an output data $D_{out}$ is caused. The skew $t_{d1}$ can be compensated by outputting the data in synchronization with an internal clock signal DLL_CLK that precedes the external clock signal CLK by the skew $t_{d1}$. At this time, the internal clock signal DLL_CLK is obtained by delaying the external clock signal CLK by a predetermined time $t_{d2}$ corresponding to $(t_{ck}-t_{d1})$. This, internal clock signal DLL_CLK is referred to as a DLL clock signal. Consequently, if the data is outputted in synchronization with the DLL clock signal, an output data $D_{out}$ is synchronized with the external clock signal CLK.

Figure 2:
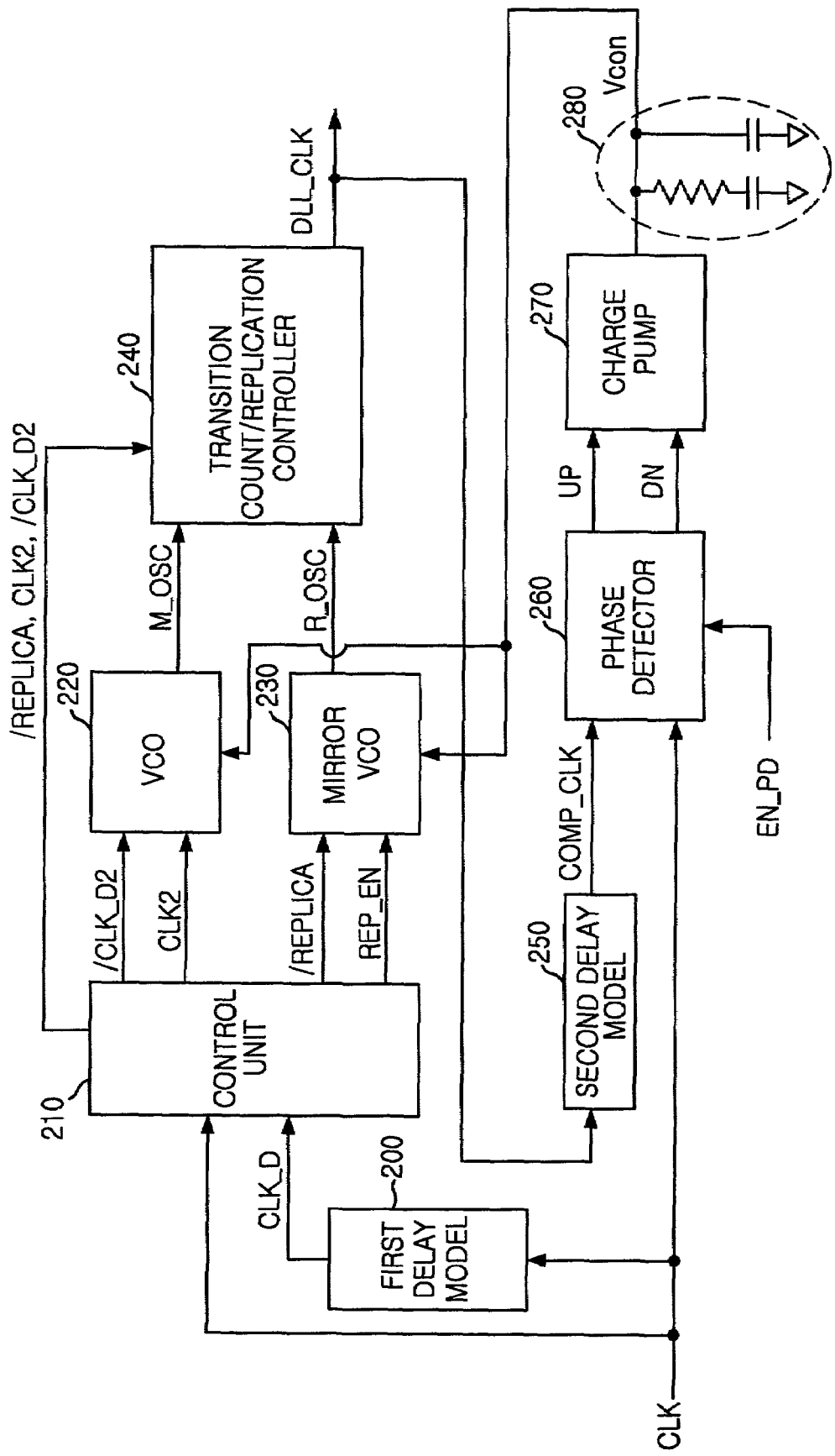
FIG. 2 is a block diagram illustrating a DLL in accordance with the present invention.

FIG. 2, is a block diagram illustrating a delay locked loop (DLL) in accordance with the present invention.

Referring to FIG. 2, the DLL in accordance with the present invention includes a first delay model 200, a control unit 210, a voltage controlled oscillator (VCO) 220, a mirror VCO 230 and a transition count/replication controller 240. Furthermore; the DLL includes a second delay model 250, a phase detector 260, a charge pump 270 and a low pass filter (LPF) 280.

The first delay model 200 delays an external clock signal CLK by a skew $t_{d1}$ between the external clock signal CLK and an output data to generate a delayed clock signal CLK_D.

The control unit 210 receives the external clock signal CLK and the delayed clock signal CLK_D to generate control signals. The control signals include a control clock signal CLK2, a delayed control signal /CLK_D2, a replication signal /REPLICA and a replication enable signal REP_EN.

Here, the control clock signal CLK2 is enabled to a high level from a first rising edge to a second rising edge of the external clock signal CLK, so that the control clock signal CLK2 has a time period two times as long as the external clock signal CLK. The delayed control signal /CLK_D2 is enabled to a low level from a first rising edge to a second rising edge of the delayed clock signal CLK_D, so that the delayed control signal /CLK_D2 has a time period two times as long as the delayed clock signal CLK_D.

The replication enable signal REP_EN is used to activate the mirror VCO 230, and the replication signal /REPLICA is a control signal used to toggle a replication oscillating signal R_OSC.

The VCO 220 performs an oscillation operation to generate a measurement oscillating signal M_OSC in response to the control clock signal CLK2 and the delayed control signal /CLK_D2. The measurement oscillating signal M_OSC is toggled while both the control clock signal CLK2 and the delayed control signal /CLK_D2 are enabled. At this time, a time period of the measurement oscillating signal M_OSC is changed according to a voltage control signal Vcon that is outputted form the charge pump 270.

The mirror VCO 230 performs an oscillation operation to generate a replication oscillating signal R_OSC in response to the replication signal /REPLICA and the replication enable signal REP_EN. The replication oscillating signal R_OSC is toggled while both the replication signal /REPLICA and the replication enable signal REP_EN are enabled. A time period of the replication oscillating signal R_OSC is also changed according to the voltage control signal Vcon.

The transition count/replication controller 240 generates the DLL clock sign DLL_CLK in response to the measurement oscillating signal M_OSC and the replication oscillating signal R_OSC.

The second delay model 250 delays the DLL clock signal DLL_CLK by the skew $t_{d1}$ to generate a comparison clock signal COMP_CLK.

The phase detector 260, in response to a phase detection enable signal EN_PD, compares a phase difference between the external clock signal CLK and the comparison clock signal COMP_CLK to generate an up pulse signal UP and a down pulse signal DN according to the phase difference.

The charge pump 270 generates the voltage control signal Vcon in response to the up pulse signal UP and the down pulse signal DN. At this time, the voltage control signal Vcon is fed back to the VCO 220 and the mirror VCO 230, to thereby change the time period of the measurement oscillating signal M_OSC and the replication oscillating signal R_OSC.

The LFP 280 removes high-frequency noise components of the voltage control signal Vcon.

FIG. 3 is a circuit diagram illustrating the VCO 220 shown in FIG. 2.

Referring to FIG. 3, the VCO 220 includes a NOR gate NOR31, a delay control unit 32, a NAND gate ND31, a delay unit 31 and an inverter INV34. The delay; control unit 32 can be implemented with voltage controlled delay (VCD) elements 310 and 320, and the delay unit 31 can be implemented with a predetermined number of inverters INV31 to INV33.

The delayed control signal /CLK_D2 and an output signal of the delay unit 31 are NORed through the NOR gate NOR31, and the delay control unit 32 delays an output signal of the NOR gate NOR31 in response to the voltage control signal Vcon.

The control clock signal CLK2 and an output signal of the delay control unit 32 are NANDed through the NAND gate ND31, and an output signal of the NAND gate ND31 is inverted and delayed through the delay unit 31. At this time, the output signal of the delay unit 31 is feedback to the NOR gate NOR31. The inverter INV34 inverts the output signal of the NAND gate ND31 to output the measurement oscillating signal M_OSC.

FIG. 4 is a circuit diagram illustrating the mirror VCO 230 shown in FIG. 2.

Referring to FIG. 4, the mirror VCO 220 includes a NOR gate NOR41, a delay control unit 42, a NAND gate ND41, a delay unit 41 and an inverter INV44. The delay control unit 42 can be implemented with voltage controlled delay (VCD) elements 410 and 420, and the delay unit 41 can be implemented with a predetermined number of inverters INV41 to INV43.

The replication clock/REPLICA and an output signal of the delay unit 41 are NORed through the NOR gate NOR41, and the delay control unit 42 delays an output signal of the NOR gate NOR41 in response to the voltage control signal Vcon. During an initial digital locking operation, the voltage control signal Vcon has a predetermined voltage level.

The replication enable signal and an output signal of the delay control unit 42 are NANDed through the NAND gate ND41, and an output signal the NAND gate ND41 is inverted and delayed through the delay unit 41. At this time, the output signal of the delay unit 41 is feedback to the NOR gate NOR41. The inverter INV44 inverts the output signal of the NAND gate ND41 to output the replication oscillating signal M_OSC.

Figure 5:
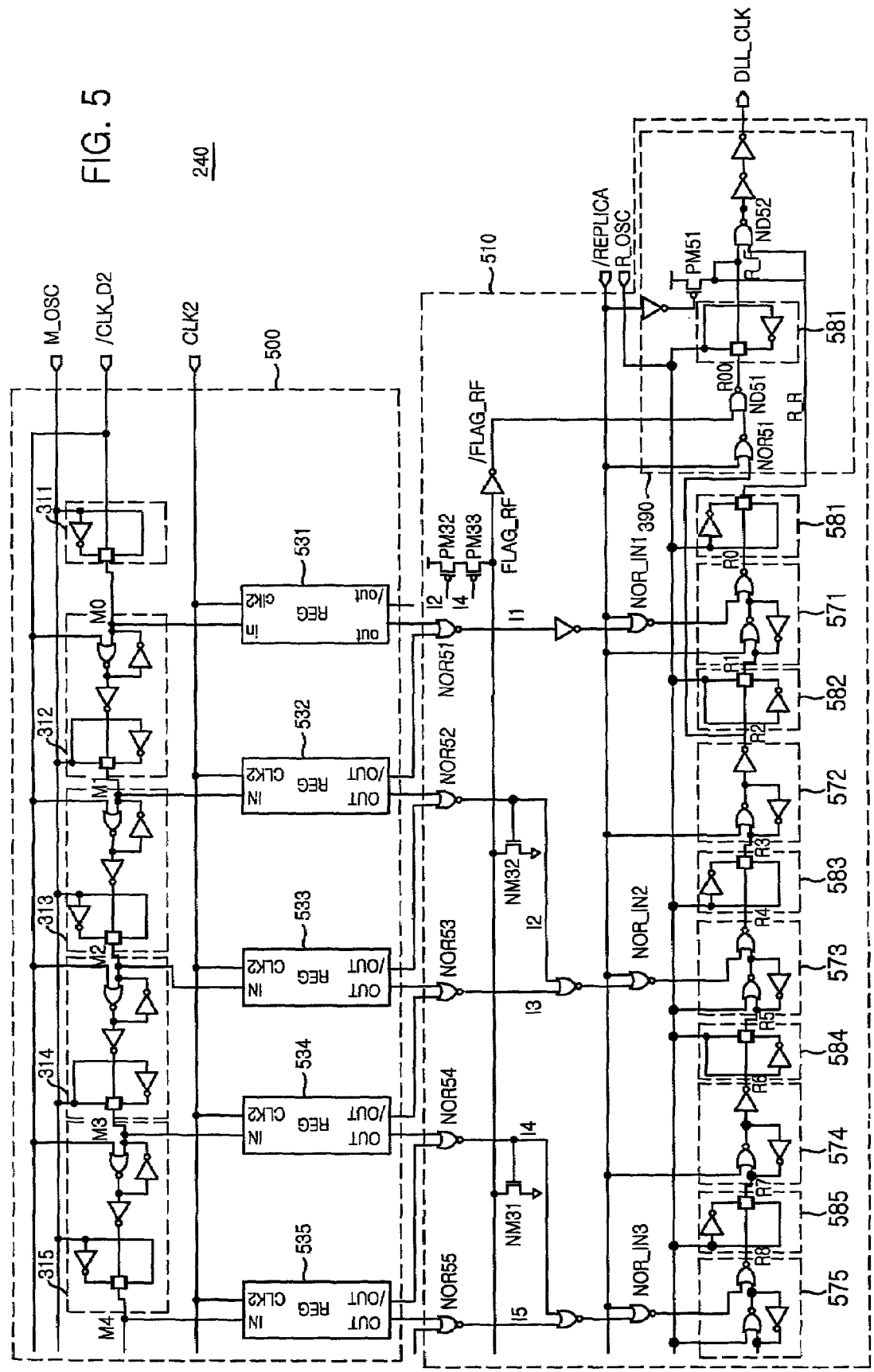
FIG. 5 is a circuit diagram illustrating a transition count/replication controller shown in FIG. 2.

FIG. 5 is a circuit diagram illustrating the transition count/replication controller 240 shown in FIG. 2.

Referring to FIG. 5, the transition count/replication controller 240 includes a delay measurement unit 500 and a delay replication unit 510.

The delay measurement unit 500 includes a plurality of delay, units 312 to 315 and registers 531 to 535. The delay units shift a low level of the delayed control signal /CLK_D2 to the nodes M0 to M4 in response to the measurement oscillating signal M_OSC. The registers 531 to 535 store shifted low levels on the nodes M0 to M4 while the control clock signal CLK2 is a high level. The shifted low levels that are stored in the registers 531 to 535 are outputted to the delay replication unit 510 in response to the control clock signal CLK2.

At this time, the skew $t_{d2}$ to be measured corresponds to a time interval between a falling edge of the delayed control signal /CLK_D2 to a falling edge of the control clock signal CLK2.

The delay replication unit 510 performs a logic operation with respect to output signals of the registers 531 to 535 to generate locking signals I1 to I5. In response to the locking signals I1 to I5, the delay replication unit 510 shifts the replication signal /REPLICA according to the replication oscillating signal R_OSC, to thereby generate the replication reset signal REP_RST and the DLL clock signal DLL_CLK.

Figure 6:
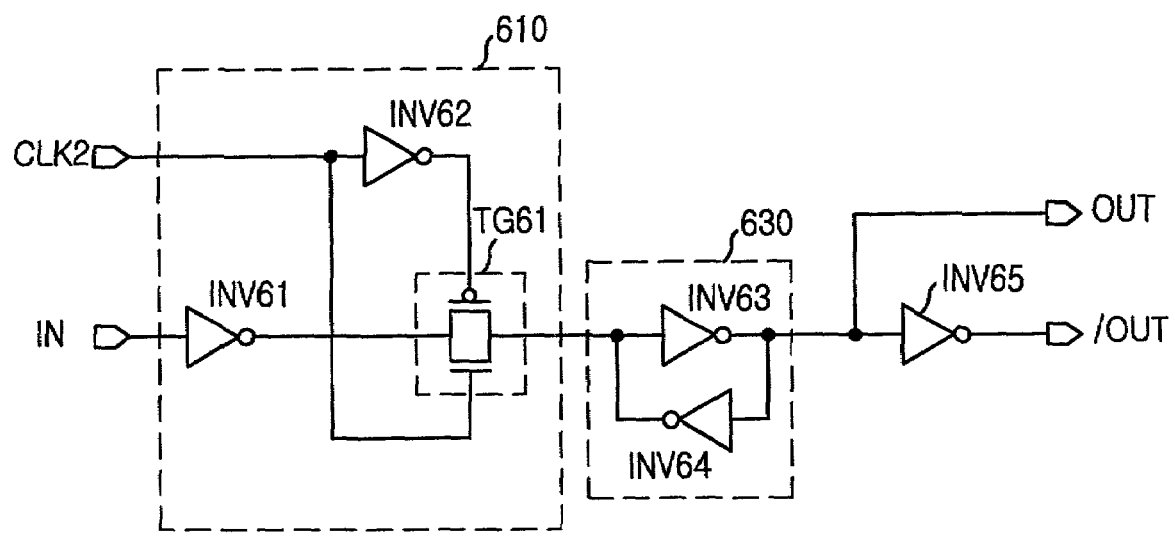
FIG. 6 is a circuit diagram illustrating a register shown in FIG. 5.

FIG. 6 is circuit diagram illustrating the registers 531 to 535 shown in FIG. 5.

Referring to FIG. 6, each register 531 to 535 includes an input unit 610 which has an input terminal receiving a voltage level of corresponding node M0 to M4 and a clock terminal receiving the control clock signal CLK2, a storage unit 630 for storing an output signal of the input unit 610, and an inverter INV65 for inverting an output signal of the storage unit 630.

The input unit 610 includes an inverter INV61 for receiving the voltage level IN of corresponding node M0 to M4 to output an inverted voltage level and a transmission gate TG61 for transmitting the inverted voltage level in response to the control clock signal CLK2. The storage unit 630 includes an inverter INV63 whose input terminal receives the output signal of the transmission gate TG and an inverter INV64 whose input terminal and whose output terminal are coupled to: an output terminal and the output terminal of the inverter INV63 respectively.

Figure 7:
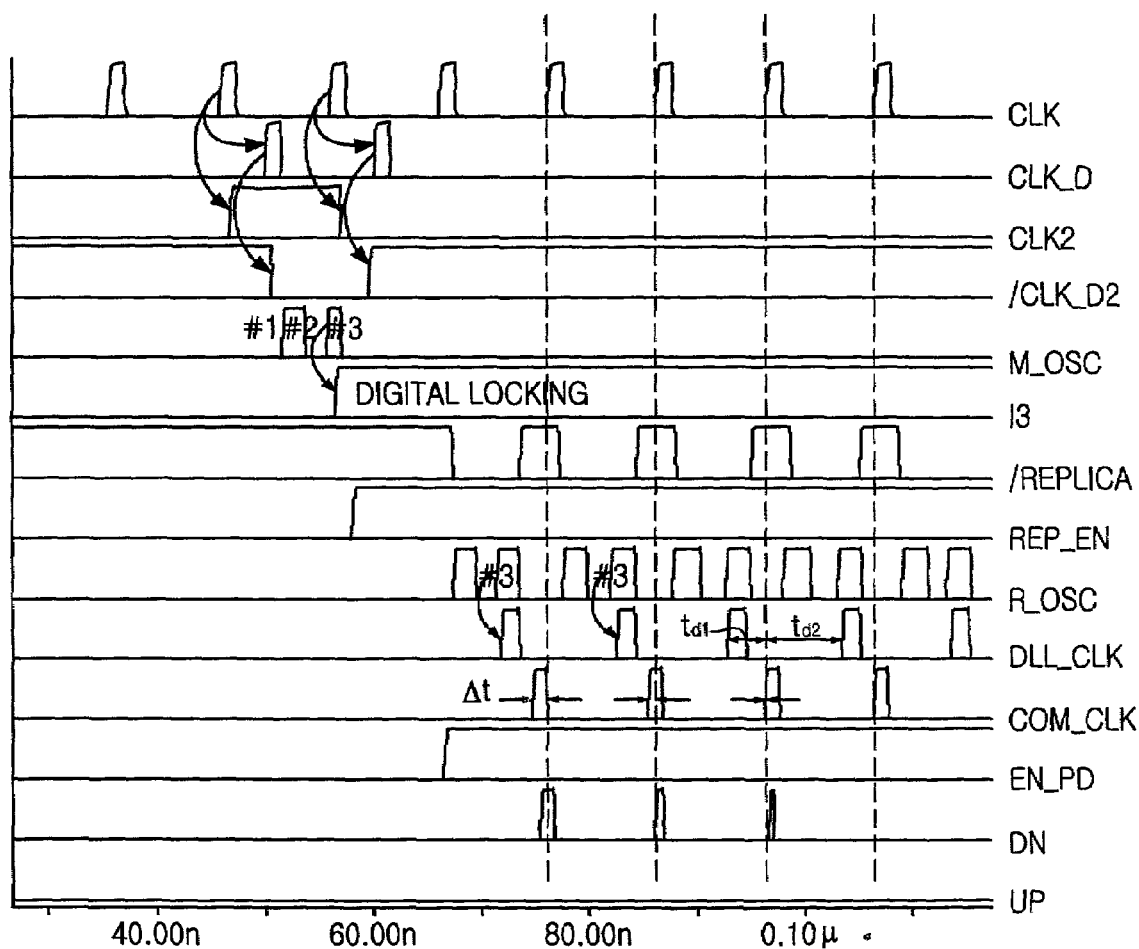
FIG. 7 is a timing chart of a DLL in accordance with the present invention.

FIG. 7 is a timing chart illustrating the DLL in accordance with the present invention.

Hereinafter, an operation of the DLL in accordance with the present invention will be described with reference to FIGS. 2 to 7.

While the control clock signal CLK2 and the delayed control signal /CLK_D2 are a high level and a low level, respectively, the VCO 220 performs the oscillation operation so that the measurement oscillating signal M_OSC is toggled. Therefore, the low level of the delayed control signal /CLK_D2 is shifted to the nodes M0 to M4 in response to the measurement oscillating signal M_OSC.

That is, the low level is transferred to the node M0 at a first rising transition of the measurement oscillating signal M_OSC; and then, the low level is transferred to the node M1 at a first falling transition of the measurement oscillating signal M_OSC. Then, the low level is transferred to the node M2 at a second rising transition of the measurement oscillating signal M_OSC. In this manner, the low level is continuously transferred to next nodes until the control clock signal CLK2 becomes a low level.

The skew $t_{d2}$ measured by the number of the level transitions of the measurement oscillating signal M_OSC. For example, if the level transition is occurred three times, the low level is transferred to the node M2 so that only the registers 531 to 533 store the low level. Thus, only a third locking signal l3 becomes a high level and the inverted flag signal /FLAG_RF becomes a low level.

Then, if the application signal /REPLICA is activated to a low level, the replication oscillating signal R_OSC is toggled and the low level is sequentially transferred through the nodes R4, R3 and R2. At the node R2, there are two paths. A first path is to transfer the low level through the nodes R00 and R_F and a second path is to transfer the low level through the nodes R1, R0 and R_R.

At this time, since the inverted flag signal /FLAG_RF is a low level, the first path is disabled by the NAND gate ND51 so that the low level is transferred through the second path, thereby generating he DLL clock signal DLL_CLK. The above-described procedure is called a digital locking operation. The voltage control signal Vcon has a predetermined voltage level until this digital locking operation is completed.

After the digital locking operation, an analog locking operation is then carried out as follows.

The second delay model 250 delays the DLL clock signal DLL_CLK by the skew $t_{d1}$ to generate the comparison clock signal COMP_CLK.

In response to the phase detector enable signal EN_PD, the phase detector 260 compares the phase difference between the eternal clock signal CLK and the comparison clock signal COMP_CLK. If the comparison clock signal COMP_CLK precedes the external clock signal CLK, the phase detector 260 generates the down pulse signal DN, and if the external clock signal CLK precedes the comparison clock signal COMP_CLK, the phase detector 260 generates the up pulse signal UP.

The charge pump 270 decreases or increases the voltage level of the voltage control signal Vcon in response to the down pulse signal DN and the up pulse signal UP, respectively. Thus, when the down pulse signal DN is generated, the charge pump 270 decreases the voltage level of the voltage control signal Vcon so that the time period of the VCO becomes longer. Thus, a skew between the external clock signal CLK and the comparison clock signal COMP_CLK is reduced, and finally, the delay time between the external clock signal CLK and the DLL clock DLL_CLK becomes exactly $t_{d2}$, i.e.; $(t_{ck}-t_{d1})$.

As described above, by generating the DLL clock through the digital locking operation and, the analog locking operation, it is possible to implement the DLL having a fast locking time and a reduced jitter.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay locked loop (DLL) for compensating for a skew between an external clock signal and an output data signal in a memory device, comprising:
    a digital locking circuit configured to receive the external clock signal and generate a DLL clock signal, wherein the DLL clock signal is a delayed version of the external clock signal; and
    an analog locking circuit configured to receive the DLL clock signal from the digital locking circuit and check a delayed version of the DLL clock signal against the external clock signal to generate a feedback signal that is fed back to the digital locking circuit.

2. The delay locked loop according to claim 1 wherein the feedback signal is used by the digital locking circuit to adjust the DLL clock signal.

3. The delay locked loop according to claim 1 wherein the analog locking circuit checks the delayed version of the DLL clock signal against the external clock signal by detecting a phase difference between the delayed version of the DLL clock signal and the external clock signal; and
    wherein the detected phase difference is used by the analog locking circuit to generate the feedback signal so as to cause the digital locking circuit to adjust the DLL clock signal accordingly.

4. The delay locked loop according to claim 3 wherein the DLL clock signal is generated by delaying the external clock signal by a predetermined time interval, wherein the predetermined time interval is calculated by subtracting the skew from a time period of the external clock signal; and
    wherein the delayed version of the DLL clock signal is generated by delaying the DLL clock signal by the skew.

5. The delay locked loop according to claim 1 wherein the DLL clock signal is used by the memory device to signal for output data thereby allowing the output data signal to be synchronized with the external clock signal.

6. The delay locked loop according to claim 1 wherein the digital locking circuit further comprises:
    a first delay circuit configured to delay the external clock signal by the skew to generate a delayed clock signal;
    a control circuit configured to receive the delayed clock signal and the external clock signal and generate a first pair and a second pair of control signals;
    a first voltage controlled oscillation circuit configured to receive the first pair of control signals and generate a measurement oscillating signal;
    a second voltage controlled oscillation circuit configured to receive the second pair of control signals and generate a replication oscillating signal; and
    a circuit configured to receive the measurement oscillating signal and the replication oscillating signal and generate the DLL clock signal.

7. The delay locked loop according to claim 6 wherein the first of the first pair of control signals is enabled to a high level from a first rising edge to a second rising edge of the external clock signal, and the second of the first pair of control signals is enabled to a low level from a first rising edge to a second rising edge of the delayed clock signal.

8. The delay locked loop according to claim 7 wherein the measurement oscillating signal is toggled while the first pair of control signals are enabled.

9. The delay locked loop according to claim 6 wherein the analog locking circuit further comprises:
   a second delay circuit configured to delay the DLL clock signal by skew to generate a comparison clock signal;
   a phase detector configured to detect a phase difference between the comparison clock signal and the external clock signal and generate a phase detector output signal based on the phase difference; and
   a voltage control circuit configured to receive the phase detector output signal and generate a voltage control signal that is then fed to the first and second voltage controlled oscillation circuits.

10. The delay locked loop according to claim 1 wherein the memory device is a synchronous dynamic random access memory.

11. A computer system incorporating the delay locked loop as recited in claim 1.

12. A synchronizing circuit for compensating for a skew between an external clock signal and an output data signal in a memory device, comprising:
   a digital locking circuit configured to receive the external clock signal and generate an output clock signal, wherein the output clock signal is a delayed version of the external clock signal; and
   an analog locking circuit configured to generate a delayed version of the output clock signal received from the digital locking circuit and compare respective phases of the delayed version of the output clock signal and the external clock signal in order to generate a feedback signal that is fed back to the digital locking circuit.

13. The synchronizing circuit according to claim 12 wherein the feedback signal is used by the digital locking circuit to adjust the output clock signal.

14. The synchronizing circuit according to claim 12 wherein the output clock signal is generated by delaying the external clock signal by a predetermined time interval, wherein the predetermined time interval is calculated by subtracting the skew from a time period of the external clock signal; and
   wherein the delayed version of the output clock signal is generated by delaying the output clock signal by the skew.

15. The synchronizing circuit according to claim 12 wherein the output clock signal is used by the memory device to signal for output data thereby allowing the output data signal to be synchronized with the external clock signal.

16. The synchronizing circuit according to claim 12 wherein the digital locking circuit further comprises:
   a first delay circuit configured to delay the external clock signal by the skew to generate a delayed clock signal;
   a control circuit configured to receive the delayed clock signal and the external clock signal and generate a first pair and a second pair of control signals;
   a first voltage controlled oscillation circuit configured to receive the first pair of control signals and generate a measurement oscillating signal;
   a second voltage controlled oscillation circuit configured to receive the second pair of control signals and generate a replication oscillating signal; and
   a circuit configured to receive the measurement oscillating signal and the replication oscillating signal and generate the output clock signal.

17. The synchronizing circuit according to claim 16 wherein the first of the first pair of control signals is enabled to a high level from a first rising edge to a second rising edge of the external clock signal, and the second of the first pair of control signals is enabled to a low level from a first rising edge to a second rising edge of the delayed clock signal.

18. The synchronizing circuit according to claim 17 wherein the measurement oscillating signal is toggled while the first pair of control signals are enabled.

19. The synchronizing circuit according to claim 16 wherein the analog locking circuit further comprises:
   a second delay circuit configured to delay the output clock signal by skew to generate a comparison clock signal;
   a phase detector configured to detect a phase difference between the comparison clock signal and the external clock signal and generate a phase detector output signal based on the phase difference; and
   a voltage control circuit configured to receive the phase detector output signal and generate a voltage control signal that is then fed to the first and second voltage controlled oscillation circuits.

20. The synchronizing circuit according to claim 12 wherein the memory device is a synchronous dynamic random access memory.

21. A computer system incorporating the synchronizing circuit as recited in claim 12.

22. A delay locked loop for compensating for a skew between an external clock signal and an output data signal in a synchronous dynamic access memory device, comprising:
   a first delay circuit configured to delay the external clock signal by a time interval equaling the skew to generate a delayed clock signal;
   a control circuit configured to receive the delayed clock signal and the external clock signal and generate a first pair and a second pair of control signals;
   a first voltage controlled oscillation circuit configured to receive the first pair of control signals and generate a measurement oscillating signal;
   a second voltage controlled oscillation circuit configured to receive the second pair of control signals and generate a replication oscillating signal;
   a circuit configured to receive the measurement oscillating signal and the replication oscillating signal and generate an output clock signal; and
   a comparison circuit configured to generate a comparison clock signal that is derived from a delayed version of the output clock signal and detect a phase difference between the comparison clock signal and the external clock signal generate a phase detector output signal based on the phase difference, wherein the phase detector output signal is used to adjust the first and second voltage controlled oscillation circuits.

23. The delay locked loop according to claim 22 wherein the first of the first pair of control signals is enabled to a high level from a first rising edge to a second rising edge of the external clock signal, and the second of the first pair of control signals is enabled to a low level from a first rising edge to a second rising edge of the delayed clock signal.

24. The delay locked loop according to claim 23 wherein the measurement oscillating signal is toggled while the first pair of control signals are enabled.

25. The delay locked loop according to claim 22 wherein the comparison clock signal is generated by delaying the output clock signal by the skew.

26. The delay locked loop according to claim 22 wherein the output clock signal is used by the memory device to signal for output data thereby allowing the output data signal to be synchronized with the external clock signal.

27. A computer system incorporating the synchronizing circuit as recited in claim 22.

28. A method for compensating for a skew between an external clock signal and an output data signal in a memory device, comprising:
- generating an output clock signal by delaying the external clock signal by a predetermined time interval calculated by subtracting the skew from a time period of the external clock signal;
- generating a comparison clock signal by delaying the output clock signal by the skew;
- comparing a phase difference between the comparison clock signal and the output clock signal to form a feedback signal; and
- using the feedback signal to adjust the output clock signal.

29. The method according to claim 28 further comprising:
- using the output clock signal to signal for output data from the memory device thereby allowing the output data signal to be synchronized with the external clock signal.

30. The method according to claim 28 wherein the generation of the output clock signal further comprises:
- generating a delayed clock signal by delaying the external clock signal by the skew;
- using the delayed clock signal and the external clock signal to generate a first pair and a second pair of control signals;
- inputting the first pair of control signals to a first voltage controlled oscillation circuit to generate a measurement oscillating signal;
- inputting the second pair of control signals to a second voltage controlled oscillation circuit to generate a replication oscillating signal; and
- using the measurement oscillating signal and the replication oscillating signal to generate the output clock signal.

31. The method according to claim 30 further comprising:
- enabling the first of the first pair of control signals to a high level from a first rising edge to a second rising edge of the external clock signal; and
- enabling the second of the first pair of control signals to a low level from a first rising edge to a second rising edge of the delayed clock signal.

32. The method according to claim 31 further comprising:
- toggling the measurement oscillating signal while the first pair of control signals are enabled.

* * * * *